(12) United States Patent
Huang et al.

(10) Patent No.: US 7,879,717 B2
(45) Date of Patent: *Feb. 1, 2011

(54) POLYCARBOSILANE BURIED ETCH STOPS IN INTERCONNECT STRUCTURES

(75) Inventors: Elbert E. Huang, Tarrytown, NY (US); Kaushik A. Kumar, Beacon, NY (US); Kelly Malone, Poughkeepsie, NY (US); Dirk Pfeiffer, Dobbs Ferry, NY (US); Muthumanickam Sankarapandian, Yorktown Heights, NY (US); Christy S. Tyberg, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/140,854

(22) Filed: Jun. 17, 2008

(65) Prior Publication Data

US 2008/0254612 A1   Oct. 16, 2008

Related U.S. Application Data

(60) Continuation of application No. 11/619,502, filed on Jan. 3, 2007, now Pat. No. 7,396,758, which is a division of application No. 10/699,238, filed on Oct. 31, 2003, now Pat. No. 7,187,081.

(60) Provisional application No. 60/484,397, filed on Jul. 2, 2003.

(51) Int. Cl.
   *H01L 21/00* (2006.01)
(52) U.S. Cl. .................................. 438/637; 438/970

(58) Field of Classification Search ......... 438/618–640, 438/970
See application file for complete search history.

(56) References Cited

U.S. PATENT DOCUMENTS

| | | | |
|---|---|---|---|
| 5,366,843 A * | 11/1994 | Jeffries, III | 430/165 |
| 5,602,060 A | 2/1997 | Kobayashi et al. | |
| 5,789,325 A | 8/1998 | Chandra et al. | |
| 6,162,743 A | 12/2000 | Chu et al. | |
| 6,395,649 B1 | 5/2002 | Wu | |
| 6,740,685 B2 * | 5/2004 | Li et al. | 521/52 |
| 6,893,955 B1 | 5/2005 | Lopatin et al. | |
| 7,396,758 B2 * | 7/2008 | Huang et al. | 438/623 |
| 2002/0172898 A1 | 11/2002 | Forester | |
| 2003/0017635 A1 | 1/2003 | Apen et al. | |
| 2005/0124153 A1 | 6/2005 | Cohen | |

\* cited by examiner

*Primary Examiner*—Richard A. Booth
(74) *Attorney, Agent, or Firm*—Scully, Scott, Murphy & Presser, P.C.; Louis J. Percello, Esq.

(57) ABSTRACT

Interconnect structures having buried etch stop layers with low dielectric constants and methods relating to the generation of such buried etch stop layers are described herein. The inventive interconnect structure comprises a buried etch stop layer comprised of a polymeric material having a composition $Si_vN_wC_xO_yH_z$, where $0.05 \leq v \leq 0.8$, $0 \leq w \leq 0.9$, $0.05 \leq x \leq 0.8$, $0 \leq y \leq 0.3$, $0.05 \leq z \leq 0.8$ for $v+w+x+y+z=1$; a via level interlayer dielectric that is directly below said buried etch stop layer; a line level interlayer dielectric that is directly above said buried etch stop layer; and conducting metal features that traverse through said via level dielectric, said line level dielectric, and said buried etch stop layer.

14 Claims, 3 Drawing Sheets

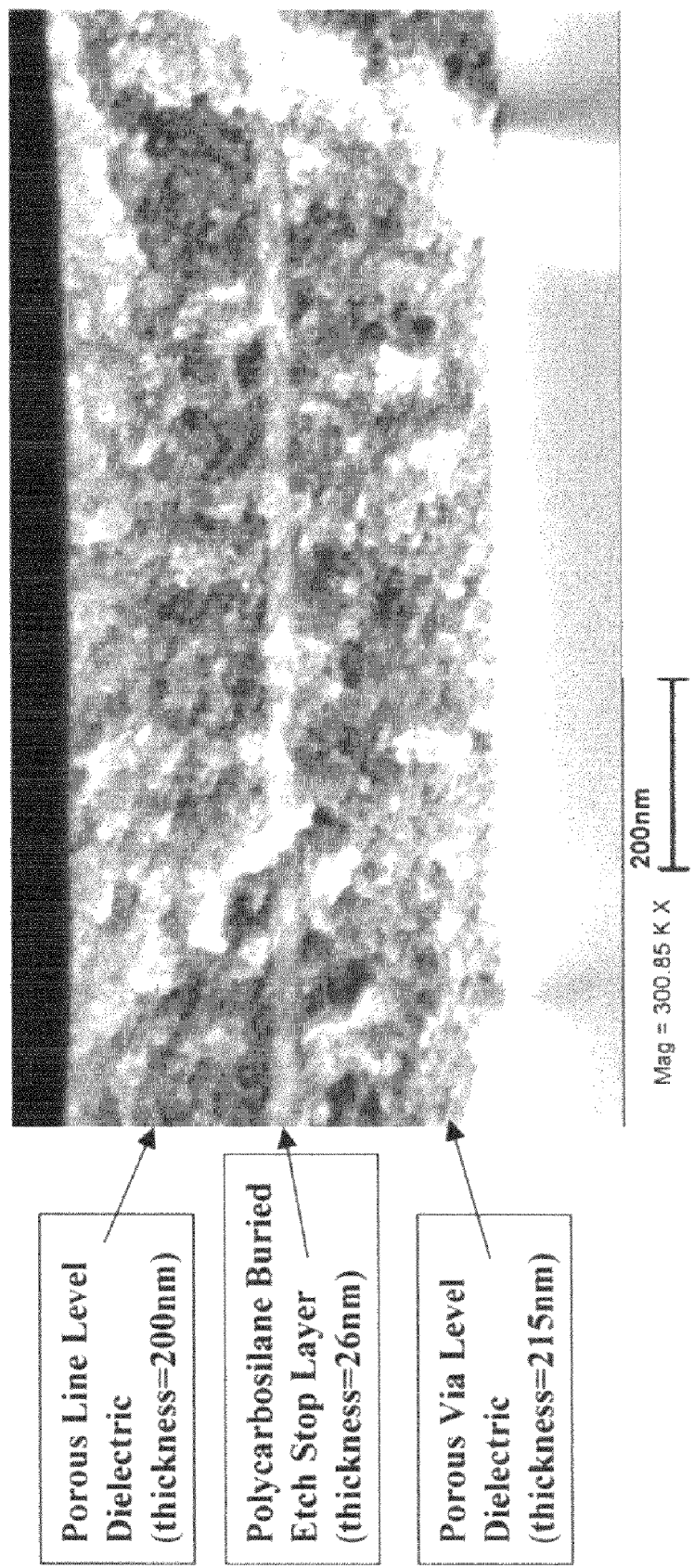
Figure 3: Scanning Electron Micrograph of Trilayer Film Having a Buried Etch Stop Layer

POLYCARBOSILANE BURIED ETCH STOPS IN INTERCONNECT STRUCTURES

RELATED APPLICATIONS

This application is a continuation of U.S. application Ser. No. 11/619,502 filed Jan. 3, 2007, now U.S. Pat. No. 7,396,758, which is a divisional of U.S. application Ser. No. 10/699,238 filed Oct. 31, 2003, now U.S. Pat. No. 7,187,081.

CROSS REFERENCE TO RELATED APPLICATIONS

The present invention claims benefit of U.S. provisional patent application 60/484,397 filed Jul. 2, 2003, the whole content and disclosure of which is incorporated by reference as is fully set forth herein. Additionally, the following U.S. Applications are incorporated herein by reference: Application Ser. No. 60/443,504 filed on Jan. 29, 2003, Application Ser. No. 60/443,361 filed on Jan. 29, 2003 and Application Ser. No. 60/463,758 filed on Apr. 17, 2003.

FIELD OF THE INVENTION

The present invention relates to the utilization of low dielectric constant buried etch stop layers in interconnect structures that are part of integrated circuits and microelectronic devices.

BACKGROUND OF THE INVENTION

Buried etch stops are often incorporated in interconnect structures, that are part of integrated circuits and microelectronic devices. Interconnect structures comprise metal lines positioned in line level interlayer dielectrics and vias positioned in via level interlayer dielectrics. Interconnect structures provide electrical communication between the multiple conductive layers of integrated circuits and microelectronic devices. Buried etch stop layers having low dielectric constants, thermal stability, and chemical contrast from other patterning dielectric layers allow for the generation of reliable interconnect structures and leads to enhanced device performance.

Buried etch stop layers should be definable by conventional dry etching processes, e.g. reactive ion etch (RIE), and should have compositions that provide chemical contrast to other layers. Additionally, it is advantageous for buried etch stop layers to exhibit thermal stability during high temperature processing and have sufficient adhesion to adjacent layers to withstand planarizing steps and other processes that produce stress on the interconnect structure. Further, the dielectric constant of the buried etch stop layer should be low in order to minimize resistance-capacitance (RC) delays and enhance performance. Buried etch stop layers may need to be permeable to the decomposition of products generated in porous dielectric systems in order to allow out-diffusion of these moieties. Finally, they should be capable of being processed in a cost effective manner.

For buried etch stop layers in interconnect structures having interlayer dielectrics deposited by spin-on-techniques it is advantageous that the buried etch stop layers also be deposited using spin-on techniques in order to decrease process time and cost. When the above layers are all deposited using spin-on-techniques, thermal annealing of the via and line layers may be performed simultaneously with the thermal curing of the buried etch stop.

The application of spin-on dielectrics as buried etch stops has been proposed; however, current implementations have been primarily limited to silsequioxanes, siloxanes, and other related chemistries that are primarily based on silicon-oxygen bonds. One potential drawback of these current implementations is poor etch selectivity with other dielectric layers. In particular, these systems may not exhibit sufficient etch selectivity to silicon carbonitrides, silicon carbides, and silicon nitrides that are commonly used as cap barrier layers. The lack of etch selectivity with these layers precludes the generation of integrated circuits in a controllable manner.

What is needed is a process for forming a buried etch stop in an interconnect structure, where the buried etch stop composition reduces manufacturing costs; produces reliable interconnect structures; and enhances device performance. What is further needed is an interconnect structure where the buried etch stop layer composition has a low dielectric constant; thermal stability; and chemical contrast which facilitates etch processing between other patterning layers.

SUMMARY OF THE INVENTION

This invention relates to buried etch stop layers and methods of forming buried etch stop layers that are utilized in interconnect structures that can be employed in any microelectronic device including, but not limited to: high-speed microprocessors, application specific integrated circuits (ASICs), and memory storage.

One aspect of the inventive buried etch stop layer is the unique chemical compositions that provide sufficient chemical contrast for dry etch processes used to define structural features in an interconnect structure. The processing of the inventive buried etch stop layer is facile as films can be applied by any solvent based process, e.g., spin coating. Additionally, the low dielectric constant (e.g. $k \leq 3.3$) of the buried etch stop layer contributes to reductions in resistance-capacitance delays, crosstalk, and power dissipation leading to enhanced chip performance. The present invention also provides many additional advantages, which shall become apparent as described below.

In the first embodiment of this invention, an interconnect structure having buried etch stop layers on a substrate is described. In broad terms, the inventive interconnect comprises:

a buried etch stop layer comprised of a polymeric material having a composition $Si_vN_wC_xO_yH_z$, where $0.05 \leq v \leq 0.8$, $0 \leq w \leq 0.9$, $0.05 \leq x \leq 0.8$, $0 \leq y \leq 0.3$, $0.05 \leq z \leq 0.8$ for $v+w+x+y+z=1$;

a via level interlayer dielectric that is directly below said buried etch stop layer, a line level interlayer dielectric that is directly above said buried etch stop layer, and conducting metal features that traverse through said via level interlayer dielectric, said line level interlayer dielectric, and said buried etch stop layer.

The interconnect structure may comprise of at least one conducting metal feature, formed on the substrate, with the substrate further comprising at least one insulating layer surrounding the conducting metal feature. The insulating layer may surround at least one conducting metal feature at its bottom, top, and lateral surfaces. The substrate may further comprise at least one metal containing barrier layer disposed on at least one insulating layer/metal feature interface. The combination of the at least one conducting metal feature and the insulating layers, may be repeated to form a multilevel interconnect stack.

The structure may be part of a silicon wafer containing microelectronic devices, a ceramic chip carrier, an organic chip carrier, a glass substrate, a gallium arsenide, silicon carbide, gallium, or other semiconductor wafer.

In the second embodiment of this invention, a method to generate an interconnect structure having buried etch stop layers is described. In broad terms, the present method comprises.

depositing a via level interlayer dielectric;

depositing a buried etch stop layer atop said via level interlayer dielectric by a solvent based approach, said buried etch stop layer comprising a polymeric material having a composition $Si_vN_wC_xO_yH_z$, where $0.05 \leq v \leq 0.8$, $0 \leq w \leq 0.9$, $0.05 \leq x \leq 0.8$, $0 \leq y \leq 0.3$, $0.05 \leq z \leq 0.8$ for $v+w+x+y+z=1$; and depositing a line level interlayer dielectric atop said buried etch stop layer.

More specifically, the polymeric material may be dissolved in a suitable solvent and coated onto the substrate having the via level interlayer dielectric to produce the buried etch stop layer. Subsequently, the line level interlayer dielectric is then coated onto the buried etch stop layer. The buried etch stop layer may be treated by any suitable process including thermal annealing, electron beam irradiation, ion irradiation, irradiation with ultraviolet and/or visible light, etc. During this process, the buried etch stop layer may crosslink into a rigid, insoluble matrix. These processes can be performed after deposition of any of the layers described above.

The buried etch stop layer may be patterned by lithographic techniques (known in the art) and etched by dry etch processes (known in the art). Multiple buried etch stop layers may be formed by repeating the above process steps. Additionally, subsequent interconnect processing steps may include other commonly used processes known in the art, e.g., metal deposition, dielectric deposition, planarization, etc.

The polymeric material comprising the buried etch stop layer is soluble in an organic solvent and can be applied as a coating to form a buried etch stop layer by a solvent based process. The polymeric material comprising the buried etch stop layer can also be a mixture of two or more polymeric components; the polymeric materials having any chain architecture. The polymeric material comprising the buried etch stop layer may be comprised of at least one of the following: polysilazanes, polysilanes, polycarbosilanes, polysilasilazane, polysilylenemethylenes, polysilacarbosilanes, polysilylcarbodiimides, polysiloxazanes, polycarbosilazanes, polysilylenemethylenes, polysilsesquiazanes, and polysilacarbosilazanes. In addition, additives such as adhesion promoters and antistriation agents can be added to the solution containing the polymeric material to improve adhesion and coating quality, respectively.

The buried etch stop layer is thermally stable to temperatures >350° C. ($\leq 1\%$ weight loss/hr) and can be crosslinked. Further, the buried etch stop layer may be insoluble to inorganic solvents. The buried etch stop layer, may have a dielectric constant ranging from about 2.2 to about 3.8. The buried etch stop layer, may also contain porosity, where the introduction of porosity further reduces the dielectric constant of the buried etch stop layer to a range of from about 1.4 to about 2.2. The pores may be generated by a removal of a sacrificial moiety that may be polymeric. The pores may also be generated by a process that involves an elimination of a high boiling point solvent. The pores may have a size scale of about 10 nanometers and may have a closed cell morphology.

Other and further objects, advantages and features of the present invention will be understood by reference to the following specification in conjunction with the annexed drawings, wherein like parts have been given like numbers.

BRIEF DESCRIPTION OF THE DRAWINGS

FIG. 3 shows a cross sectional scanning electron micrograph of a buried etch stop layer placed between a porous via level interlayer dielectric and a porous line level interlayer dielectric layer.

DESCRIPTION OF THE PREFERRED EMBODIMENTS

A detailed description of the structures and methods involving buried etch stop layers is presented below. The buried etch stop layers can be utilized to enable the fabrication of interconnects that can be used in any microelectronic device. It is noted that in the accompanying drawings like and corresponding elements are referred to by like reference numbers.

Figure 1:
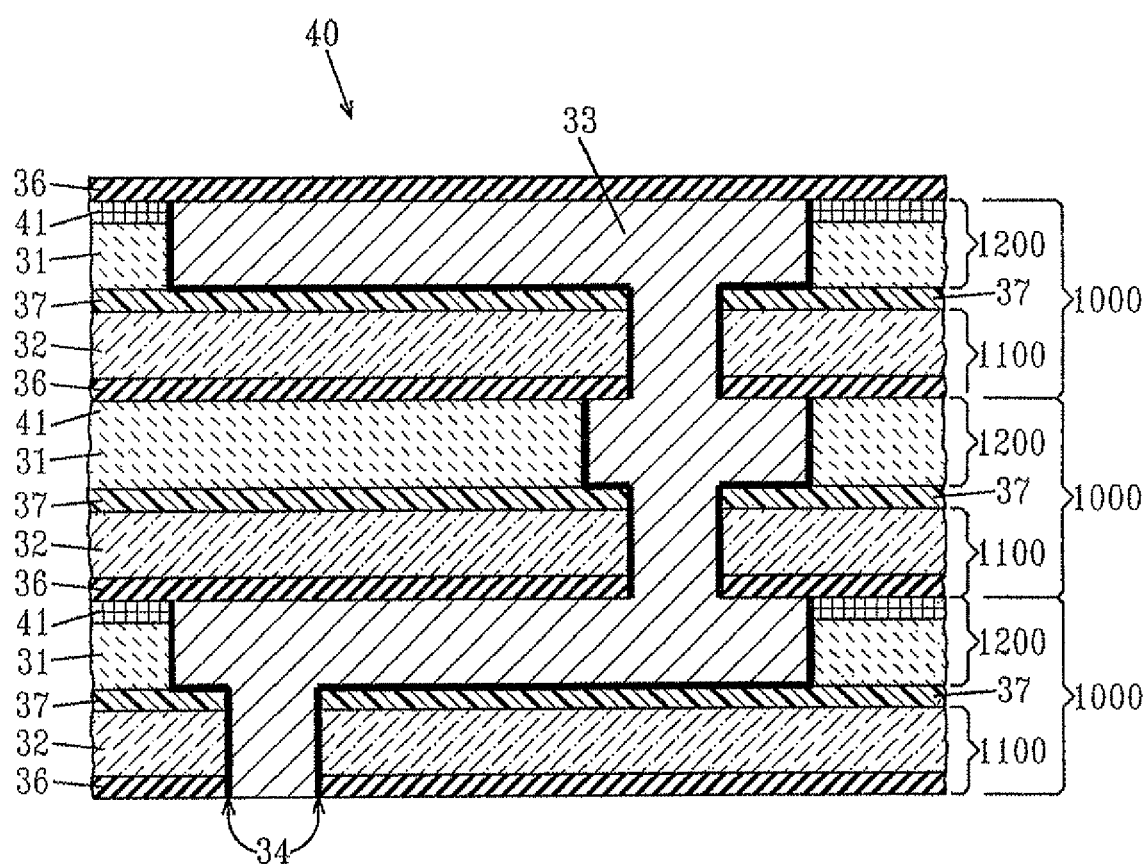
FIG. 1 is a schematic showing a cross section of a structure having a buried etch stop layer of the invention.

Referring to FIG. 1, in the first embodiment, an interconnect structure 40, is comprised of multiple levels 1000 where each level comprises of at least a via level interlayer dielectric 1100 and a line level interlayer dielectric 1200. The interconnect structure 40 comprises conducting metal features 33 that traverse through the structure and may have interfaces with a lining metal barrier 34. The conducting metal features 33 and lining metal barrier 34 are surrounded by dielectrics. The dielectrics in the via level interlayer dielectric 1100 include the via dielectric 32 and an optional cap barrier layer film 36, where the optional cap barrier film 36 may be positioned underlying the via dielectric 32. The dielectrics in the line level interlayer dielectric 1200 include the line dielectric 31 and an optional chemical mechanical polishing stop layer 41, where the chemical mechanical polishing stop layer is positioned atop the line dielectric 31. A buried etch stop layer 37 having a low dielectric constant is positioned between the via level interlayer dielectric 1100 and the line level interlayer dielectric 1200.

The buried etch stop layer 37 may be comprised of a polymeric material which may be comprised of at least one of the following: polysilazanes, polysilanes, polycarbosilanes, polysilasilazane, polysilylenemethylenes, polysilacarbosilanes, polysilylcarbodiimides, polysiloxazanes, polycarbosilazanes, polysilylenemethylenes, polysilsesquiazanes, and polysilacarbosilazanes. The polymeric material comprising the buried etch stop layer 37 may include pendant functional groups bonded to the polymer chain backbone including, hydrido, vinyl, allyl, alkoxy, hydroxy, silyl, and alkyl groups. Preferably, the buried etch stop layer 37 may be comprised of a polyureamethylvinylsilazane (KiON), a polycarbomethylsilane, or a polyallylhydridocarbosilane.

The buried etch layer 37 has a dielectric constant ranging from about 1.4 to about 3.8 and may have a thickness ranging from about 5.0 nanometers to about 50 nanometers. A low porosity buried etch stop layer 37 will have a dielectric constant between about 2.2 and about 3.8. The buried etch stop 37 may be porous, with pores that are less than about 10.0 nanometers in size having a closed cell morphology. If the buried etch stop 37 is porous, it may have a dielectric constant between about 1.4 and 2.2. The buried etch stop layer 37 may be permeable to low molecular weight volatile products and may be thermally stable to temperatures in excess of about 350° C. The buried etch stop layer 37 and via level dielectric layer 1100 may contain a pattern that is identical. The buried etch stop layer 37 and line level dielectric layer 1200 may contain a pattern that is identical. Adhesion promoters may be placed at least on the top or bottom of the interfaces of the buried etch stop layer 37. In a preferred embodiment the buried etch stop layer 37 will have a dielectric constant ranging from about 2.2 to about 2.8 and have a thickness on the order of about 25.0±5.0 nanometers.

The via and/or line dielectric 32, 31 may be a porous ultralow-k dielectric with a dielectric constant between about 1.2 and about 2.8. Additionally, the via or line dielectric 32, 31 may have pores that are less than about 10.0 nanometers in size and may have pores that have a closed cell morphology. Preferably, the porous ultralow-k dielectric may be comprised of a crosslinked polyarylene system such as porous SiLK™ (trademark of Dow Chemical) or a silsesquioxane or siloxane system such as JSR5109™ (trademark of Japanese Synthetic Rubber). Alternatively, the porous ultralow-k dielectric may be a CVD deposited dielectric having the composition $Si_vN_wC_xO_yH_z$, where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$. The via level dielectric 32 and line level dielectric 31 may be different or identical materials including, but not limited too: polyarylene ethers, polysiloxanes, polysilsesquioxanes, or other CVD deposited dielectrics having similar compositions. The via dielectric 32 and/or line dielectric 31 may have a thickness ranging from about 30.0 nanometers to about 500.0 nanometers.

The conducting metal features 33 may be comprised of at least one of the following: copper, aluminum, gold, silver, and alloys containing these metals. The conducting metal features 33 may comprise at least one lining of a metal containing barrier layer 34. The metal containing barrier layer 34 has a composition comprising tantaulum, tungsten, ruthenium, cobalt, or titanium.

The interconnect structure 40 may further comprise a cap barrier layer 36 that is positioned on a conducting metal features 33, and line dielectric 31. The cap barrier layer 36 may be comprised of at least one of the following: silicon nitride, silicon carbide, hydrogenated silicon nitride, hydrogenated silicon carbide, and hydrogenated silicon carbonitride, and may have a thickness ranging from about 5.0 nanometers to about 200.0 nanometers. In addition, the interconnect structure 40 may have a chemical mechanical polishing stop layer 41 positioned overlying a portion of the conducting metal features 33 and/or line dielectric 31.

The use of the buried etch stop layer 37 to produce interconnect structures 40 can be performed in any manner known in the art including dual damascene processes. For dual damascene processing, either a single or clustered hardmask scheme may be used.

Figure 2:
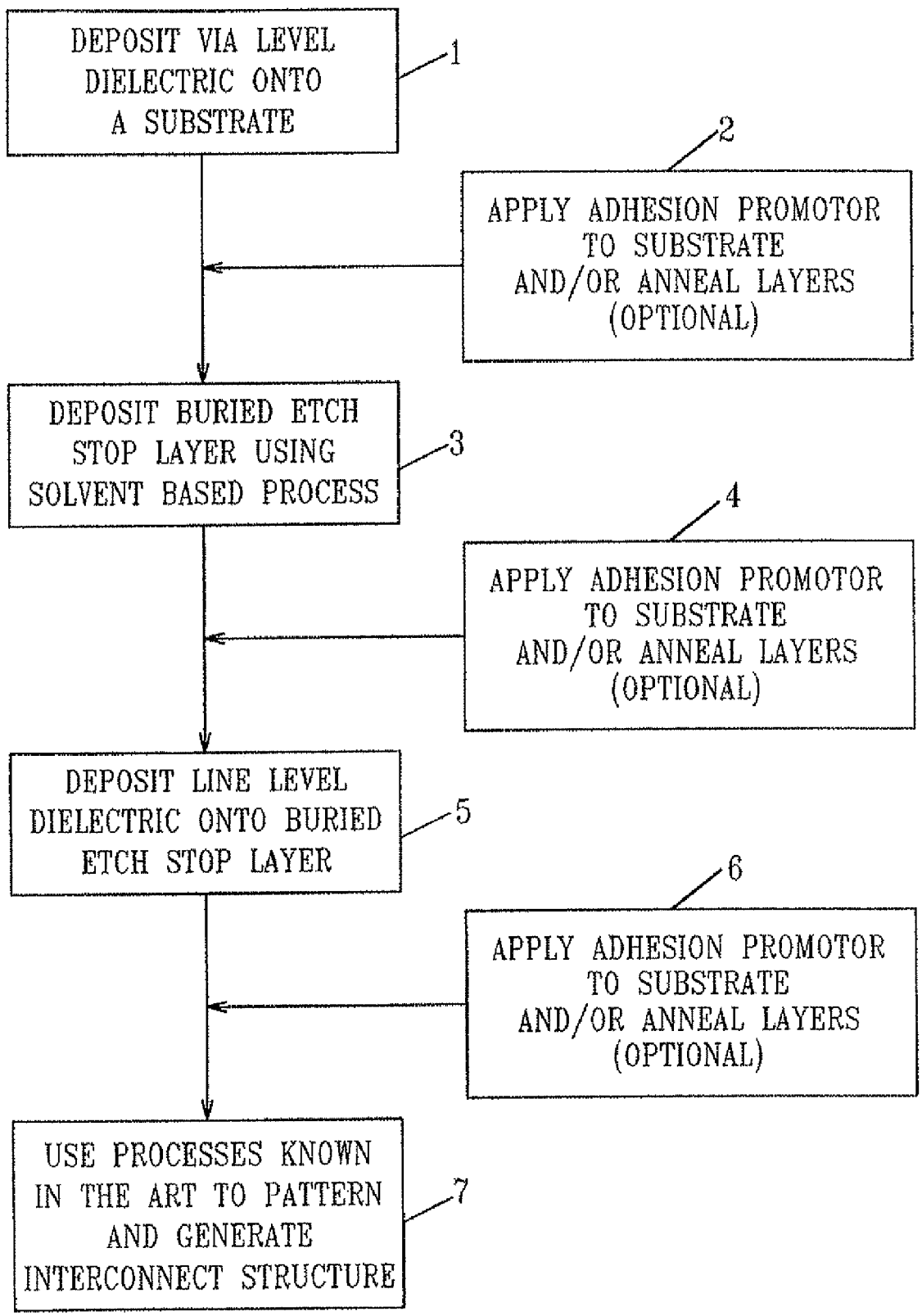
FIG. 2 is a schematic showing a generalized method to form the inventive buried etch stop layer.

Referring to FIG. 2, a method for producing an interconnect structure 40 having the buried etch stop layer 37 is described. In step 1, a via dielectric 32 is deposited onto a substrate. In optional step 2, adhesion promoters may be applied to the surface of the via dielectric 32 and/or annealing process steps may be performed. In step 3, the buried etch stop layer 37 is deposited atop the via dielectric 32 by a solvent based approach. In optional step 4, adhesion promoters may be applied to the top surface of the buried etch stop layer 37 and/or annealing process steps may be performed. In step 5, a line dielectric 31 is deposited atop buried etch stop layer 37. In optional step 6, adhesion promoters may be applied to the surface of the line dielectric 31 and/or annealing process steps may be performed. Finally, in step 7, typical processes known in the art including photolithography, deposition of patterning layers, deposition of metal features 33, chemical mechanical polishing, dry etch processes, wet cleans, etc. can be used to generate the interconnect structure 40. These steps can be performed repetitively in order to generate a multilevel interconnect structure 40. The above process is now described in greater detail.

The via and/or line dielectric 31, 32 may be deposited by either a solvent based approach or a chemical vapor deposition approach. The buried etch stop layer 37 is deposited using a solvent based approach in which the polymeric material forming the buried etch stop layer 37 may be dissolved in a suitable solvent and coated onto the substrate having the via level interlayer dielectric 1100 to produce the buried etch stop layer 37.

The solvent based approach used for any of the layers may involve a solution having an organic solvent and may include one or a combination of the following: propylene glycol methyl ether acetate (PGMEA), propylene glycol methyl ether (PGME), toluene, xylenes, anisole, mesitylene, butyrolactone, cyclohexanone, hexanones, ethyl lactate, and heptanones. The solvent based approach may be one of: spin coating, spray coating, scan coating, and dip coating.

A sacrificial moiety to produce porosity may also be codissolved in the solution containing the polymeric material prior to deposition of the buried etch stop layer 37. The sacrificial moiety may be a sacrificial polymeric material that degrades into low molecular weight byproducts that are expelled from the film during annealing processes. The sacrificial polymeric material may be one of, a combination of, or a copolymer of: poly(stryenes), poly(esters), poly(methacrylates), poly(acrylates), poly(glycols), poly(amides), and poly(norbornenes). Alternatively, the porosity may be generated from an approach that utilizes a high boiling point solvent that is expelled from the film during annealing.

The annealing of the buried etch stop layer 37, and/or line level dielectric layers 31, 31 may be performed by at least one of the following: thermal curing, electron irradiation, ion irradiation, irradiation with ultraviolet and/or visible light. Thermal curing may be performed at temperatures between about 50-500° C. and under inert atmospheres which may be comprised of: nitrogen, argon, helium, hydrogen, and combinations thereof. During annealing, crosslinking mechanisms may occur in at least one of the following layers: via level dielectric, buried etch stop layer, or line level dielectric.

Optionally, adhesion promoters may be used to enhance adhesion of the buried etch stop layer 37 to the via dielectric 32 or the line dielectric 31. The adhesion promoter may be applied onto the via dielectric 32 prior to the deposition of the buried etch stop layer 37, codissolved in the solution containing the buried etch stop layer 37, applied onto the buried etch stop layer 37 prior to the deposition of the line dielectric 31, and/or codissolved in the solution containing the line dielectric 31. The adhesion promoter may have the composition $Si_xL_yR_z$, wherein L is selected from the group consisting of hydroxy, methoxy, ethoxy, acetoxy, alkoxy, carboxy, amines, halogens, and R is selected from the group consisting of hydrido, methyl, ethyl, vinyl, and phenyl (any alkyl or aryl). Preferred adhesion promoters include, but are not limited to: HOSP BeST AP™ (Trademark of Honeywell International Inc.), hexamethyldisilazane, vinyltriacetoxysilane, aminopropyltrimethoxysilane, and vinyl trimethoxysilane. In addition, an antistriation agent may be optionally codissolved in the solution containing the buried etch stop layer 37 to increase film uniformity.

The interconnect structure 40 can be generated by a dual damascene integration approach involving a clustered hardmask integration scheme whereby patterns are first defined in hardmask patterning layers and subsequently transferred by dry etch processes into the line dielectric 31, buried etch stop layer 37, and via dielectric 32. Other processes known in the art may be used to generate the interconnect structure 40 following dual damascene integration. These include processes such as photolithography, deposition of patterning layers, metal containing lining barrier deposition, metal plating, chemical mechanical polishing, and other common processes known in the art.

The dual damascene integration may alternatively be performed by a process involving a via first full etch followed by a trough open etch step (herein after referred to as line level patterning). This process involves definition of the via patterns by known processes (e.g., photolithography, reactive ion etching) where the via pattern is first transferred through the line dielectric 31, buried etch stop layer 37, and via dielectric 32. Next the line level pattern is generated and transferred into the line dielectric 31 and may or may not be transferred into the buried etch stop layer 37. Subsequent, processes known in the art can then be used to generate the interconnect structure 40.

Dry etch processes involving a reactive plasma may be used to define the line dielectric 31, buried etch stop layer 37, and via dielectric 32. The reactive plasma may be generated from a fluorinated organic moiety and may include one or a combination of the following $CH_3F$, $C_2F_6$, He, and $CO_2$. The buried etch stop layer 37 may etch at least about five times slower than the line dielectric 31 and may function as a hard mask during dry etching to pattern the line dielectric 31. The buried etch stop 37 may etch at least about five times slower than the via dielectric 32 and may function as a hard mask during dry etching to pattern the via dielectric 32. The buried etch stop 37 may etch at least about five times slower than the cap barrier layer 36 for dry etches used to pattern the cap barrier layer 36.

Conducting metal features 33, preferably comprising copper, may be formed using conventional metal depositing processes including, but not limited to: electroplating.

Referring to FIG. 3, a scanning electron micrograph shows a cross section of a trilayer film comprised of a porous line interlayer dielectric 45 atop a polycarbosilane buried etch stop layer 46 atop a porous via interlayer dielectric 47 that was generated by deposition of the three layers followed by a elevated temperature anneal at 425° C. under a nitrogen atmosphere whereby the porosity in the via dielectric and line dielectric is produced through thermolysis of a sacrificial material. As the image shows, the polycarbosilane buried etch stop layer 46 is distinct and has clearly defined interfaces with the porous via and line dielectrics. Since the decomposition of the sacrificial material to form the pores was performed using the elevated temperature anneal after deposition of each of the layers, it can be concluded that the decomposition byproducts of the sacrificial material in the via interlayer dielectric 47 could permeate through the polycarbosilane buried etch stop layer 46.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for generating an interconnect structure comprising:

depositing a via level interlayer dielectric;

depositing a buried etch stop layer atop said via level interlayer dielectric by a solvent based approach, said buried etch stop layer comprising a polymeric material having a composition $Si_vC_xO_yH_z$, where $0.05 \leq v \leq 0.8$, $0.05 \leq x \leq 0.8$, $0 \leq y \leq 0.3$, $0.05 \leq z \leq 0.8$ for $v+x+y+z=1$;

depositing a line level interlayer dielectric atop said buried etch stop layer.

2. The method of claim 1 wherein said deposition of said via level interlayer dielectric, said line level interlayer dielectric, or a combination of said line level interlayer dielectric and said via level interlayer dielectric is by a solvent based approach.

3. The method of claim 1 wherein the said solvent based approach comprises a solution having an organic solvent selected from a group consisting of: propylene glycol methyl ether acetate (PGMEA), propylene glycol methyl ether (PGME), toluene, xylenes, anisole, mesitylene, butyrolactone, cyclohexanone, hexanones, ethyl lactate, and heptanones.

4. The method of claim 1 wherein said solvent based approach comprises spin coating, spray coating, scan coating, or dip coating.

5. The method of claim 1 further comprising annealing said via level interlayer dielectric, said line level interlayer dielectric, said buried etch stop layer, or a combination of said line level interlayer dielectric, said via level interlayer dielectric and said buried etch stop layer by a process selected from the group consisting of: thermal curing, electron irradiation, ion irradiation, or irradiation with ultraviolet or visible light.

6. The method of claim 5 wherein at least one of said via level interlayer dielectric, said buried etch stop layer, or said line level interlayer dielectric crosslink during said annealing.

7. The method of claim I wherein an adhesion promoter is used to enhance adhesion of said buried etch stop layer to said via level interlayer dielectric or line level interlayer dielectric, wherein said adhesion promoter comprises $Si_xL_yR_z$, wherein L is selected from the group consisting of hydroxy, methoxy, ethoxy, acetoxy, alkoxy, carboxy, amines and halogens, and R is selected from the group consisting of hydrido, alkyl and aryl.

8. The method of claim 1 wherein said solvent based approach further comprises an antistriation agent.

9. The method of claim 1 wherein a dual damascene integration approach is utilized to generate said interconnect structure, wherein patterns are defined in at least one hardmask layer and subsequently transferred by dry etch processes into said line level interlayer dielectric, said buried etch stop layer, and said via level interlayer dielectric.

10. The method of claim 9, wherein said dual damascene integration is performed with a full via level interlayer dielectric etch followed by a line level interlayer dielectric etch.

11. The method of claim 9, wherein the said dual damascene integration involves dry etch processes involving a reactive plasma that are used to define the line level interlayer dielectric, buried etch stop layer, and via level interlayer dielectric.

12. The method of claim 1, wherein said buried etch stop layer etches at least about five times slower than said line level interlayer dielectric.

13. The method of claim 1, wherein said buried etch stop layer etches at least about five times slower than said via level interlayer dielectric.

14. The method of claim 1, wherein said buried etch stop layer etches at least about five times slower than a cap barrier layer.

* * * * *